US012740333B2

(12) United States Patent
Zhang et al.

(10) Patent No.: US 12,740,333 B2
(45) Date of Patent: Sep. 15, 2026

(54) SEMICONDUCTOR INTEGRATED CIRCUIT DEVICE WITH FIRST MEMORY CELL AND THIRD MEMORY CELL, AND MANUFACTURING METHOD THEREFOR

(71) Applicant: XIAMEN INDUSTRIAL TECHNOLOGY RESEARCH INSTITUTE CO., LTD., Xiamen (CN)

(72) Inventors: Yajun Zhang, Xiamen (CN); Tingying Shen, Xiamen (CN); Lijun Shan, Xiamen (CN); Taiwei Chiu, Xiamen (CN); Yu Liu, Xiamen (CN); Szu-chun Kang, Xiamen (CN)

(73) Assignee: XIAMEN INDUSTRIAL TECHNOLOGY RESEARCH INSTITUTE CO., LTD., Xiamen (CN)

( * ) Notice: Subject to any disclaimer, the term of this patent is extended or adjusted under 35 U.S.C. 154(b) by 366 days.

(21) Appl. No.: 18/292,340

(22) PCT Filed: Aug. 18, 2022

(86) PCT No.: PCT/CN2022/113246

§ 371 (c)(1),
(2) Date: Jan. 26, 2024

(87) PCT Pub. No.: WO2023/103443

PCT Pub. Date: Jun. 15, 2023

(65) Prior Publication Data

US 2024/0349629 A1 Oct. 17, 2024

(30) Foreign Application Priority Data

Dec. 10, 2021 (CN) ........................ 202111503891.9

(51) Int. Cl.
*H10N 70/00* (2023.01)
*H10B 63/00* (2023.01)

(52) U.S. Cl.
CPC .......... *H10N 70/063* (2023.02); *H10B 63/30* (2023.02); *H10N 70/021* (2023.02); *H10N 70/841* (2023.02); *H10N 70/8833* (2023.02)

(58) Field of Classification Search
CPC ............ H10N 70/063; H10N 70/8833; H10N 70/021; H10N 70/841; H10B 63/30
(Continued)

(56) References Cited

U.S. PATENT DOCUMENTS 10,164,183 B2 * 12/2018 Chou .................. H10N 70/011
10,608,177 B2 * 3/2020 Lv ........................ H10N 70/841
(Continued)

FOREIGN PATENT DOCUMENTS

CN 104485418 A 4/2015
CN 106030801 A 10/2016
(Continued)

*Primary Examiner* — Jami Valentine Miller
(74) *Attorney, Agent, or Firm* — Bayramoglu Law Offices LLC

(57) ABSTRACT

A semiconductor integrated circuit device includes a resistive layer having a trench-like structure with an upward opening, a first electrode located on an outer side of the resistive layer, and a second electrode located on an inner side of the resistive layer; the first electrode and the second electrode are opposite to each other on two sides of a sidewall of the resistive layer; and the resistive layer, the first electrode and the second electrode form a first memory cell. A manufacturing method includes forming a first electrode on a substrate, the substrate including a first via connected with a first metal layer; etching a recess in the first electrode at a position staggered from the first via and forming a resistive layer in the recess; and forming a second electrode in the opening of the resistive layer to obtain a first memory cell.

7 Claims, 11 Drawing Sheets

(58) Field of Classification Search
USPC .............................................................. 257/4
See application file for complete search history.

(56) References Cited

U.S. PATENT DOCUMENTS

| | | | | |
|---|---|---|---|---|
| 2004/0248339 | A1 | 12/2004 | Lung et al. | |
| 2015/0340605 | A1* | 11/2015 | Tajima ................ | H10B 63/845<br>257/4 |
| 2016/0359108 | A1* | 12/2016 | Majhi .................. | H10N 70/066 |
| 2017/0331034 | A1* | 11/2017 | Lv ...................... | H10N 70/8828 |
| 2018/0151799 | A1* | 5/2018 | Chou ..................... | H10B 63/30 |
| 2019/0393266 | A1 | 12/2019 | Ando et al. | |

FOREIGN PATENT DOCUMENTS

| | | | |
|---|---|---|---|
| CN | 108123032 | A | 6/2018 |
| CN | 108878644 | A | 11/2018 |
| CN | 114220916 | A | 3/2022 |
| TW | 201419450 | A | 5/2014 |

* cited by examiner

SEMICONDUCTOR INTEGRATED CIRCUIT DEVICE WITH FIRST MEMORY CELL AND THIRD MEMORY CELL, AND MANUFACTURING METHOD THEREFOR

CROSS-REFERENCE TO RELATED APPLICATIONS

This application is a U.S. national phase entry of International Patent Application No. PCT/CN2022/113246 filed on Aug. 18, 2022, which is based upon and claims priority to Chinese Patent Application No. 202111503891.9, filed on Dec. 10, 2021, the entire contents of which are incorporated herein by reference.

TECHNICAL FIELD

The present application relates to the field of semiconductor devices, and in particular to a redundant/resistive random access memory (RRAM) and a manufacturing method therefor.

BACKGROUND

A basic structure of an RRAM includes a top electrode, a resistive layer and a bottom electrode. The RRAM usually adopts a sandwich structure which is stacked from bottom to top. Since a contact area between the electrode and the resistive layer is too large, the distribution of conductive filaments is more random, which is not conducive to the consistency of devices.

In addition, when the sandwich structure is etched, a sidewall of the resistive layer will be damaged, which will affect the performance of the resistive layer.

If it is the RRAM with the sandwich structure connected by a via, the resistive layer will be uneven due to the depression at a support of a via material, which will also affect the performance of the resistive layer.

SUMMARY

Aiming at the above technical problems, the present application creatively provides a semiconductor integrated circuit device and a manufacturing method therefor.

According to a first aspect of an embodiment of the present application, a semiconductor integrated circuit device is provided, including: a resistive layer having a trench-like structure with an upward opening, a first electrode located on an outer side of the resistive layer, and a second electrode located on an inner side of the resistive layer; the first electrode and the second electrode are opposite to each other on two sides of a sidewall of the resistive layer; and the resistive layer, the first electrode and the second electrode form a first memory cell.

According to an implementation of an embodiment of the present application, the semiconductor integrated circuit device may further include: a via below the first electrode; a first metal layer connected to the first electrode through the via; and a second metal layer connected to the second electrode.

According to an implementation of an embodiment of the present application, the semiconductor integrated circuit device may further include a second memory cell having a same structure as the first memory cell; a first electrode of the second memory cell may be connected with the first metal layer through a via below, a second electrode of the second memory cell may be connected with the second metal layer, and a partition may be formed between the first memory cell and the second memory cell.

According to an implementation of an embodiment of the present application, the semiconductor integrated circuit device may further include a third memory cell having a same structure as the first memory cell, and a first electrode of the third memory cell may be connected with the first metal layer through a via below.

According to an implementation of an embodiment of the present application, a second electrode of the third memory cell may be connected with a third metal layer through the second metal layer and a via above, thereby forming a 1T2R structure.

According to a second aspect of an embodiment of the present application, there is provided a manufacturing method of a semiconductor integrated circuit device, the manufacturing method including: forming a first electrode on a substrate, the substrate including a first via connected with a first metal layer; etching a recess in the first electrode at a position staggered from the first via, and forming a resistive layer in the recess, such that the resistive layer has a trench-like structure with an upward opening; and forming a second electrode in the opening of the resistive layer to obtain a first memory cell.

According to an implementation of an embodiment of the present application, the manufacturing method may further include: forming a second metal layer on the second electrode and connecting the second metal layer with the second electrode of the first memory cell.

According to an implementation of an embodiment of the present application, the manufacturing method may further include: manufacturing a second memory cell while manufacturing the first memory cell, such that a first electrode of the second memory cell may be connected with the first metal layer through a via below, and a second electrode of the second memory cell may be connected with the second metal layer; and forming a partition between the first memory cell and the second memory cell.

According to an implementation of an embodiment of the present application, the manufacturing method may further include: manufacturing a third memory cell while manufacturing the first memory cell, such that a first electrode of the third memory cell may be connected with the first metal layer through a via below.

According to an implementation of an embodiment of the present application, the manufacturing method may further include: forming a via and a third metal layer above a second electrode of the third memory cell, such that the second electrode of the third memory cell may be connected with the third metal layer through the second metal layer and the via above, thereby forming a 1T2R structure.

The present application discloses a semiconductor integrated circuit device and a manufacturing method therefor. The semiconductor integrated circuit device adopts a structure in which a first electrode is connected with a resistive layer on a sidewall of the resistive layer and is connected out from an inner side of the resistive layer through a second electrode, so that a conductive filament is formed on the sidewall of the resistive layer after a voltage is applied. In this way, a region where a resistance change occurs can be reduced by reducing a height of the first electrode, so that an electric field is applied on the resistive layer in a more concentrated manner during an electrical operation process, thus improving the uniformity of the device. In addition, since the resistive region is located on the sidewall of the resistive layer and is formed by deposition and has not been etched, so that there is no damage caused by etching.

Meanwhile, the fact that the resistive region is located on the sidewall of the resistive layer can also avoid the uneven resistive layer caused by depression of a via, so that the resistive layer has better performance and longer service life.

It should be understood that the implementation of the embodiments of the present application does not need to achieve all the above beneficial effects, but a specific technical solution can achieve specific technical effects, and other implementations of the embodiments of the present application can also achieve beneficial effects not mentioned above.

BRIEF DESCRIPTION OF THE DRAWINGS

The above and other objectives, features and advantages of exemplary embodiments of the present application will be easily understood by reading the following detailed description with reference to the drawings. Several embodiments of the present application are illustrated by way of example and not limitation in the drawings.

In the drawings, the same or corresponding reference numerals indicate the same or corresponding parts.

DETAILED DESCRIPTION OF THE EMBODIMENTS

In order to make the objectives, features and advantages of the present application more obvious and understandable, the technical solutions in embodiments of the present application will be described below clearly and completely with reference to the drawings in the embodiments of the present application. Obviously, the described embodiments are only some of the embodiments of the application, but not all of the embodiments. Based on the embodiments in the present application, all other embodiments obtained by those of ordinary skill in the art without involving any inventive effort are within the scope of protection of the present application.

In the description of this specification, the description referring to the terms "an embodiment", "some embodiments", "examples", "specific examples" or "some examples" means that the specific features, structures, materials or characteristics described in connection with the embodiment or example are included in at least one embodiment or example of the present application. Furthermore, the specific features, structures, materials or characteristics described may be combined in any one or more embodiments or examples in a suitable manner. In addition, those skilled in the art can combine and arrange different embodiments or examples and features of different embodiments or examples described in this description without conflicts.

In addition, the terms "first" and "second" are used for descriptive purposes only and are not to be construed as indicating or implying relative importance or to implicitly indicate the number of technical features indicated. Therefore, a feature defined as "first" and "second" can explicitly or implicitly include at least one of these features. In the description of the present application, "a plurality of" means two or more, unless otherwise specifically defined.

Figure 1:
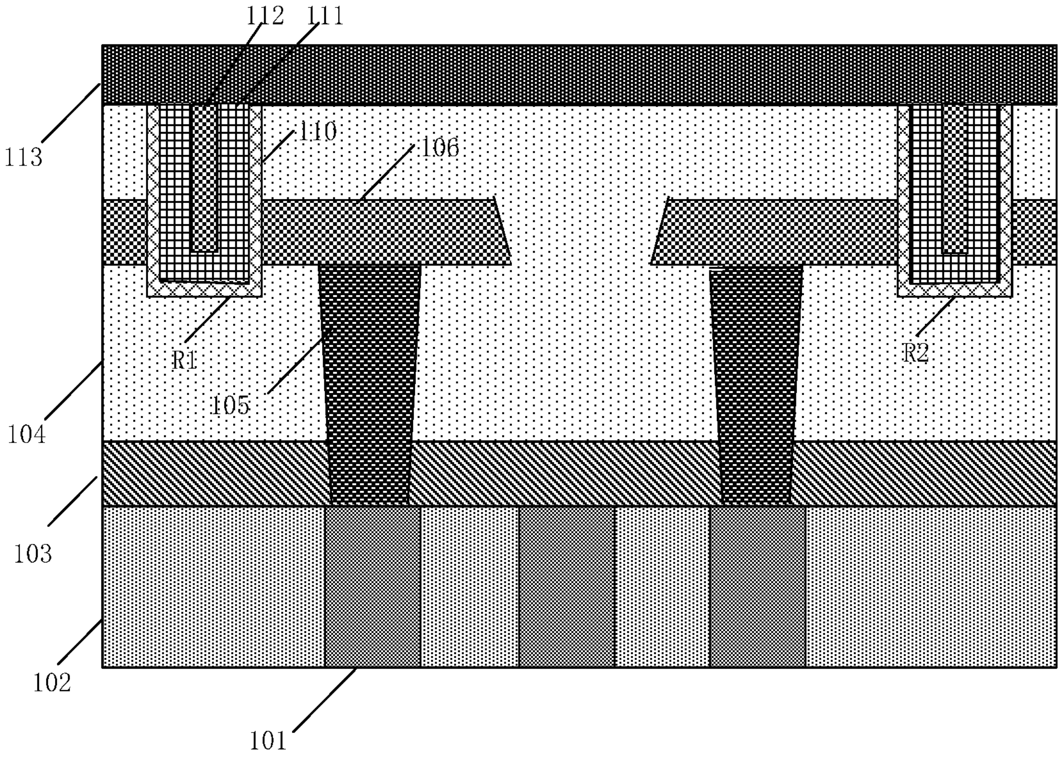
FIG. 1 shows a structural sectional view of an embodiment of a semiconductor integrated circuit device of the present application.

FIG. 1 shows a structural sectional view of an embodiment of a semiconductor integrated circuit device of the present application. As shown in FIG. 1, the semiconductor integrated circuit device includes a resistive layer 110 having a trench-like structure with an upward opening, a first electrode 106 located on an outer side of the resistive layer 110, and a second electrode 112 located on an inner side of the resistive layer 110. The first electrode 106 and the second electrode 112 are opposite to each other on two sides of a sidewall of the resistive layer 110, and the resistive layer 110, the first electrode 106 and the second electrode 112 form a first memory cell.

The resistive layer 110 may be made of one or more resistive materials. Common resistive materials include: alumina ($Al_xO_y$), copper oxide ($Cu_xO_y$), hafnium oxide ($Hf_xO_y$) and other transition metal oxides (TMO).

The first electrode 106 and the second electrode 112 may be made of one or more electrode materials. Commonly used electrode materials include: aluminum (Al), copper (Cu), gold (Au), platinum (Pt), tantalum (Ta), tantalum nitride (TaN), titanium (Ti), titanium nitride (TiN), tungsten (W), tungsten nitride (WN), etc.

In the semiconductor integrated circuit device of the embodiment, one oxygen ion reservoir (OIR) 111 is further disposed between the resistive layer 110 and the second electrode 112, so as to attract or store more oxygen when a voltage is applied. The materials of the OIR 111 mainly include titanium (Ti), tantalum (Ta), etc. The OIR 111 is a gain structure that makes the performance of the memory cell better, and it is not a necessary structure of the memory cell, and an implementer can choose to provide it or not as required.

As shown in FIG. 1, the semiconductor integrated circuit device in the embodiment adopts a structure such that the first electrode 106 and the second electrode 112 are opposite to each other on two sides of the sidewall of the resistive layer 110. As long as the first electrode 106 and the second electrode 112 are respectively connected to circuits of different electrodes, an electric field can be formed on the sidewall of the resistive layer 110 after a voltage is applied, and when the voltage reaches a formation voltage a conductive filament can be formed to obtain a resistive region.

In this way, a region where a resistance change occurs can be reduced by reducing a height of the first electrode 106, so that an electric field is applied on the resistive layer 110 in a more concentrated manner during an electrical operation process, thus improving the uniformity of the device.

In addition, since the resistive region is located on the sidewall of the resistive layer 110 and is formed by deposition and has not been etched, so that there is no damage caused by etching. Moreover, the fact that the resistive region is located on the sidewall of the resistive layer 110 can also avoid the uneven resistive layer caused by depression of a via, so that the resistive layer 110 has better performance and longer service life.

The semiconductor integrated circuit device of the embodiment further includes: a via 105 below the first electrode 106, a first metal layer 101 connected to the first electrode 106 through the via 105, and a second metal layer 113 connected to the second electrode 112.

The first metal layer 101 and the second metal layer 113 are respectively connected with circuits in a semiconductor basic circuit device, so that the resistive region can be formed on the sidewall of the resistive layer 110 after the voltage is applied.

Theoretically, as long as the memory cell with the above structure is provided, it is only necessary to connect the first electrode 106 and the second electrode 112 to the circuits of different electrodes respectively, regardless of a wiring way. However, using a wiring structure formed by the via 105, the first metal layer 101 and the second metal layer 113 as shown in FIG. 1 of the embodiment can make the structure of the semiconductor integrated circuit device more compact and a plane area smaller.

In addition, the semiconductor integrated circuit device of the embodiment includes a plurality of memory cells. FIG. 1 shows only two of the memory cells, namely, a first memory cell R1 shown on the left, and a second memory cell R2 shown on the right. The second memory cell R2 has the same structure as the first memory cell R1; a first electrode of the second memory cell is also connected to the first metal layer 101 through a via below; and a second electrode is also connected to the second metal layer 113, but the first memory cell R1 and the second memory cell R2 are separated.

Figure 2:
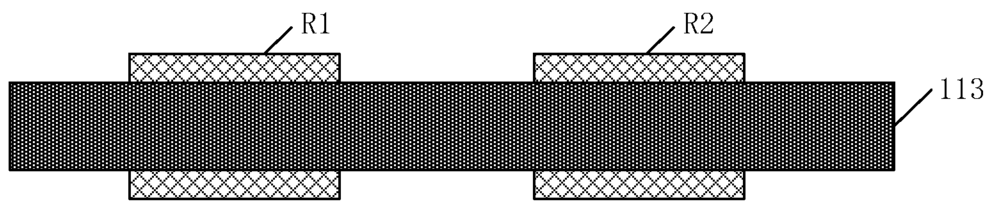
FIG. 2 shows a top view of the embodiment shown in FIG. 1.

FIG. 2 shows a top view of the first memory cell R1 and the second memory cell R2 according to the semiconductor integrated circuit device of the embodiment. As shown in FIG. 2, the second metal layer 113 is mainly disposed directly above the first memory cell R1 and the second memory cell R2, and is connected with the first memory cell R1 and the second memory cell R2 separately.

In addition, the semiconductor integrated circuit device of the embodiment also includes some other commonly-used parts, such as an insulating layer 104, a dielectric layer 103 above the substrate 102, and the like. These parts are exemplary, and not intended to limit the semiconductor integrated circuit device of the present application, and the implementer may use any suitable layout and design depending on the implementation requirements and implementation conditions.

Figure 3:
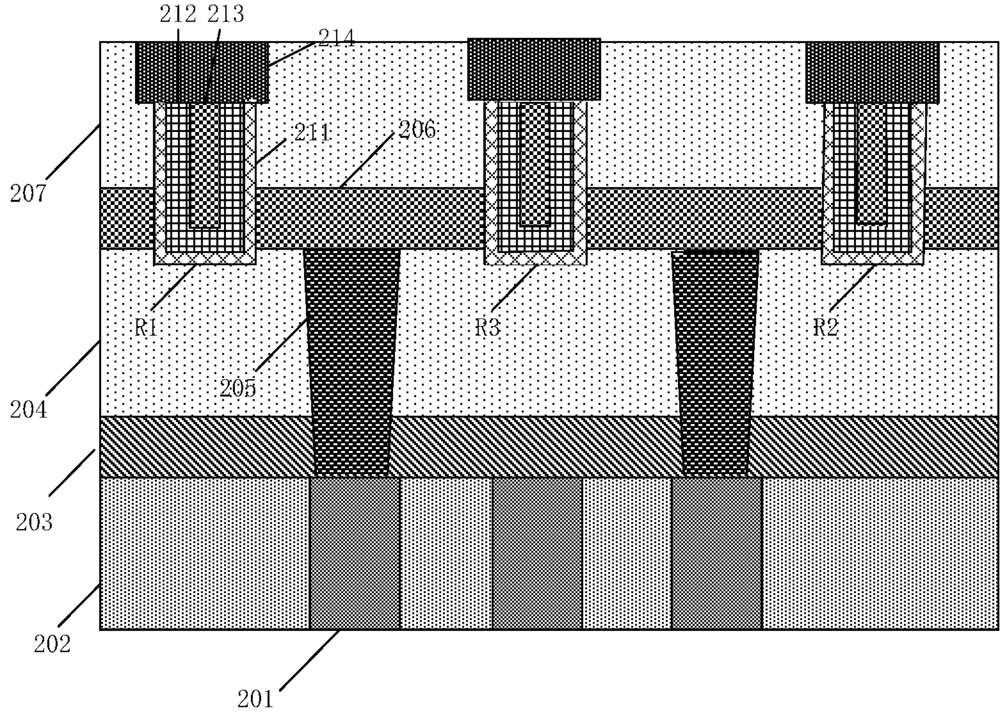
FIG. 3 shows a structural sectional view of another embodiment of a semiconductor integrated circuit device of the present application.

FIG. 3 shows a structural sectional view of another embodiment of a semiconductor integrated circuit device of the present application.

The semiconductor integrated circuit device of the embodiment shown in FIG. 3 includes the following structures similar to those of the embodiment shown in FIG. 1: a first memory cell R1, which is formed by a resistive layer 211 having a trench-like structure with an upward opening, a first electrode 206 located on an outer side of the resistive layer 211, a second electrode 213 located on an inner side of the resistive layer 211, and an oxygen ion reservoir 212; and a second cell R2 with the same structure as the first memory cell R1.

First electrodes (e.g., the first electrodes 206) of the first memory cell R1 and the second memory cell R2 are both connected with a first metal layer(s) (e.g., a first metal layer 201) through via(s) below (e.g., via(s) 205), and second electrodes (e.g., the second electrodes 213) of the first memory cell R1 and the second memory cell R2 are both connected with a second metal layer(s) (e.g., a second metal layer 214).

Similar to the embodiment shown in FIG. 1, the embodiment shown in FIG. 3 also includes some other commonly-used parts, such as an insulating layer 204 and an insulating layer 207, a dielectric layer 203 on the substrate 202, etc.

In addition, the semiconductor integrated circuit device of the embodiment shown in FIG. 3 further includes a third memory cell R3 with the same structure as the first memory cell R1, and a first electrode of the third memory cell R3 is connected with the first metal layer 201 through a via 205 below. Although the second metal layer 214 is also disposed on the third memory cell R3 located between the first memory cell R1 and the second memory cell R2, the second metal layer 214 on the third memory cell R3 is a metal block isolated and is not connected to any circuit. Therefore, when a voltage is applied to the second metal layer 214 to which a circuit is connected, the third memory cell R3 is not energized.

Figure 4:
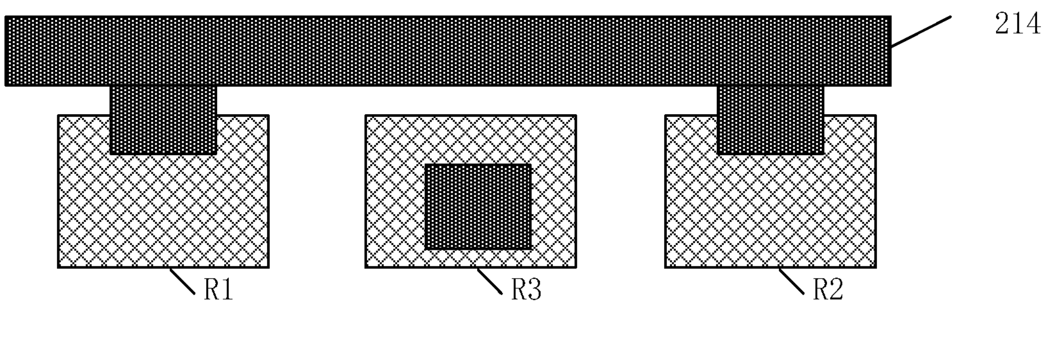
FIG. 4 shows a top view of the embodiment shown in FIG. 3.

FIG. 4 shows a top view of the semiconductor integrated circuit device of the embodiment shown in FIG. 3. As shown in FIG. 4, the first memory cell R1, the second memory cell R2 and the third memory cell R3 are all connected to the second metal layer 214. The difference is that the second metal layers 214 of the first memory cell R1 and the second memory cell R2 are connected together, and the second metal layers 214 are bit lines of the first memory cell R1 and the second memory cell R2. The second metal layer 214 on the third memory cell R3 is a metal block isolated, and will not be connected out by the second metal layer 214.

Compared with the embodiment shown in FIG. 1, the embodiment shown in FIG. 3 has a more balanced structure, especially when polishing, and the stress is more uniform, so that the manufactured semiconductor integrated circuit device has higher quality. Meanwhile, the existence of R3 makes it possible to make 1T1R and 1T2R on a same set of mask merely by changing a photomask of 215/216, which is convenient for adjustment according to actual needs.

Figure 5:
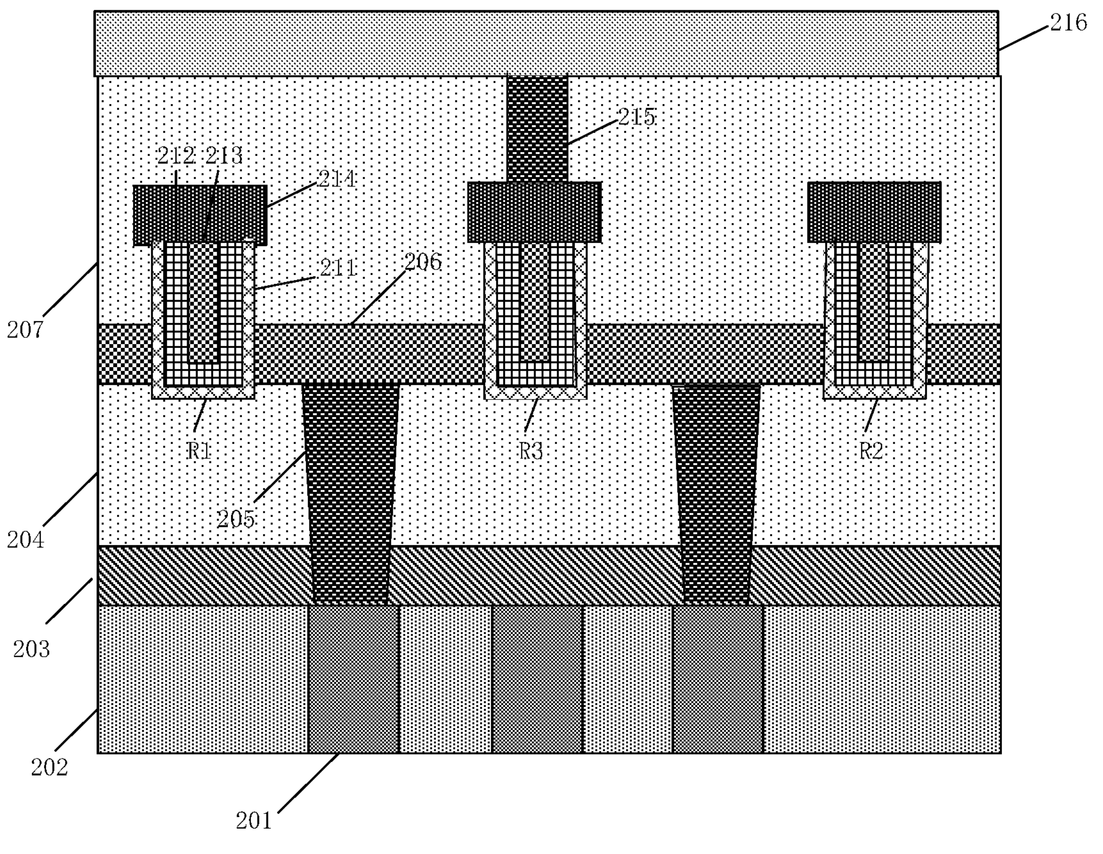
FIG. 5 shows a structural sectional view of another embodiment of a semiconductor integrated circuit device of the present application.

FIG. 5 shows a structural sectional view of another embodiment of a semiconductor integrated circuit device of the present application.

On the basis of the semiconductor integrated circuit device of the embodiment shown in FIG. 3, the semiconductor integrated circuit device of the embodiment shown in FIG. 5 further connects the second electrode of the third memory cell R3 with a third metal layer 216 through a via 215 above, thereby forming a 1T2R structure.

Figure 6:
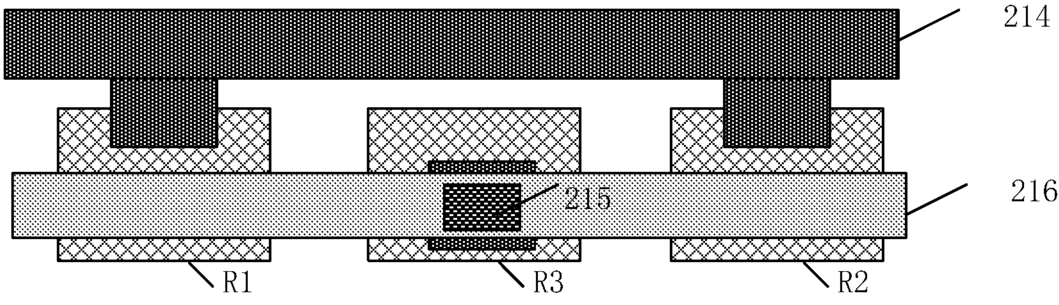
FIG. 6 shows a top view of the embodiment shown in FIG. 5.

FIG. 6 shows a top view of the semiconductor integrated circuit device of the embodiment shown in FIG. 5. As shown in FIG. 6, both the first memory cell R1 and the second memory cell R2 are connected out by the second metal layers 214, and the third memory cell R3 is not connected out by the second metal layer 214, but, with the second metal layer 214 as a landing pad, is connected with the third metal layer 216 through a via 215 formed in the second metal layer 214 and is connected out by the third metal layer 216.

In this way, the first memory cell R1 and the third memory cell R3 are jointly connected to the first metal layer 201 through the via 205 below the first electrode 206, and the first metal layer 201 can be connected to a same transistor through a same source line. The second electrode of the first memory cell R1 is connected to the second metal layer 214, the second metal layer 214 is connected with a first bit line; and the second electrode of the third memory cell R3 is connected to the third metal layer 216, the third metal layer 216 is connected with a second bit line. Therefore, the first memory cell R1 and the third memory cell R3 form two resistive memories that can be independently controlled. The first bit line may independently control the first memory cell R1, while the second bit line may independently control the third memory cell R3, thus achieving a structure in which one transistor is connected with two resistive memories (1T2R).

In addition, by stacking more resistive memories at different heights in a vertical direction, the 1T2R structure can further increase the storage capacity without increasing the plane area, so as to meet increasing miniaturization requirements.

Figure 7:
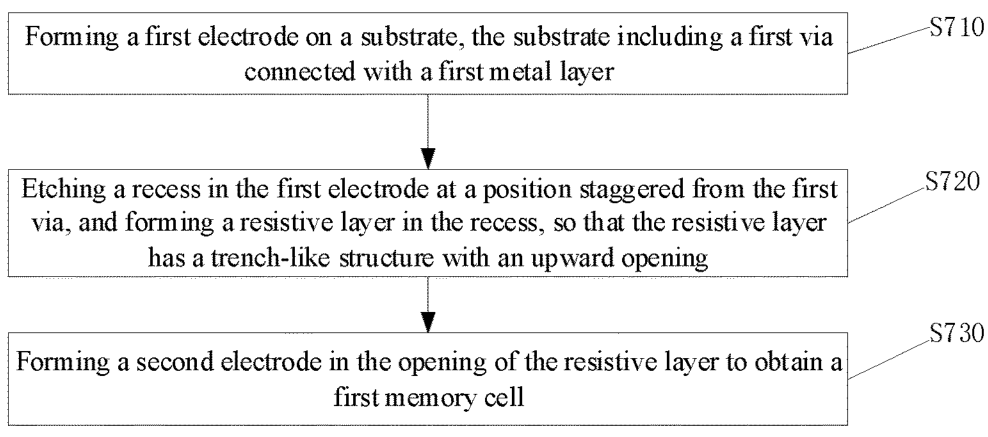
FIG. 7 shows a flow diagram of a manufacturing method of a semiconductor integrated circuit device of the present application.

The present application also provides a manufacturing method of a semiconductor integrated circuit device. As shown in FIG. 7, the manufacturing method includes the following operations: operation S710, forming a first electrode on a substrate, the substrate including a first via connected with a first metal layer; operation S720, etching a recess in the first electrode at a position staggered from the first via, and forming a resistive layer in the recess, so that the resistive layer has a trench-like structure with an upward opening; and operation S730, forming a second electrode in the opening of the resistive layer to obtain a first memory cell.

In operation S710, the substrate also includes a dielectric layer with a via, a circuit connected to the first metal layer, etc. The first electrode is formed on the substrate usually by depositing an electrode material, and then patterning to form a plurality of isolated memory cells. Any suitable electrode material can be used as the electrode material, and any suitable deposition process can also be used as the deposition process, such as physical vapor deposition, chemical vapor deposition, atomic deposition, etc.

In operation S720, the recess is etched at the position staggered from the first via, and the resistive layer is formed in the recess, so that the first electrode can be located on an outer side of the resistive layer; and a resistive layer material is deposited in the recess so that the trench-like structure with the upward opening may be formed. Any suitable existing material can be used as the resistive layer material, and any suitable deposition process can also be used as the deposition process, such as physical vapor deposition, chemical vapor deposition, atomic deposition, etc.

Then, the second electrode located on an inner side of the resistive layer can be obtained by depositing the electrode material in the opening in operation S730. In this way, the memory cell with the first electrode and the second electrode located on two sides of the sidewall of the resistive layer can be obtained.

It should be noted that the above steps are only main steps, but not all steps for manufacturing the semiconductor integrated circuit device of the embodiment of the present application. In a process of manufacturing the semiconductor integrated circuit device, it may also include steps of depositing an oxygen barrier layer, depositing an oxygen ion reservoir and forming other structures, etc., based on the product design of the semiconductor integrated circuit device. Any used deposition process can be selected according to the specific implementation, such as physical vapor deposition, chemical vapor deposition, atomic deposition, etc.

According to an implementation of an embodiment of the present application, the manufacturing method further includes: forming a second metal layer on the second electrode and connecting the second metal layer with the second electrode of the first memory cell.

According to an implementation of an embodiment of the present application, the manufacturing method further includes: manufacturing a second memory cell while manufacturing the first memory cell, so that a first electrode of the second memory cell is connected with the first metal layer through a via below, and a second electrode of the second memory cell is connected with the second metal layer; and forming a partition between the first memory cell and the second memory cell.

According to an implementation of an embodiment of the present application, the manufacturing method further includes: manufacturing a third memory cell while manufacturing the first memory cell, so that a first electrode of the third memory cell is connected with the first metal layer through a via below.

According to an implementation of an embodiment of the present application, the manufacturing method further includes: forming a via and a third metal layer above a second electrode of the third memory cell, so that the second electrode of the third memory cell is connected with the third metal layer through the via above, thereby forming a 1T2R structure.

Figure 8:
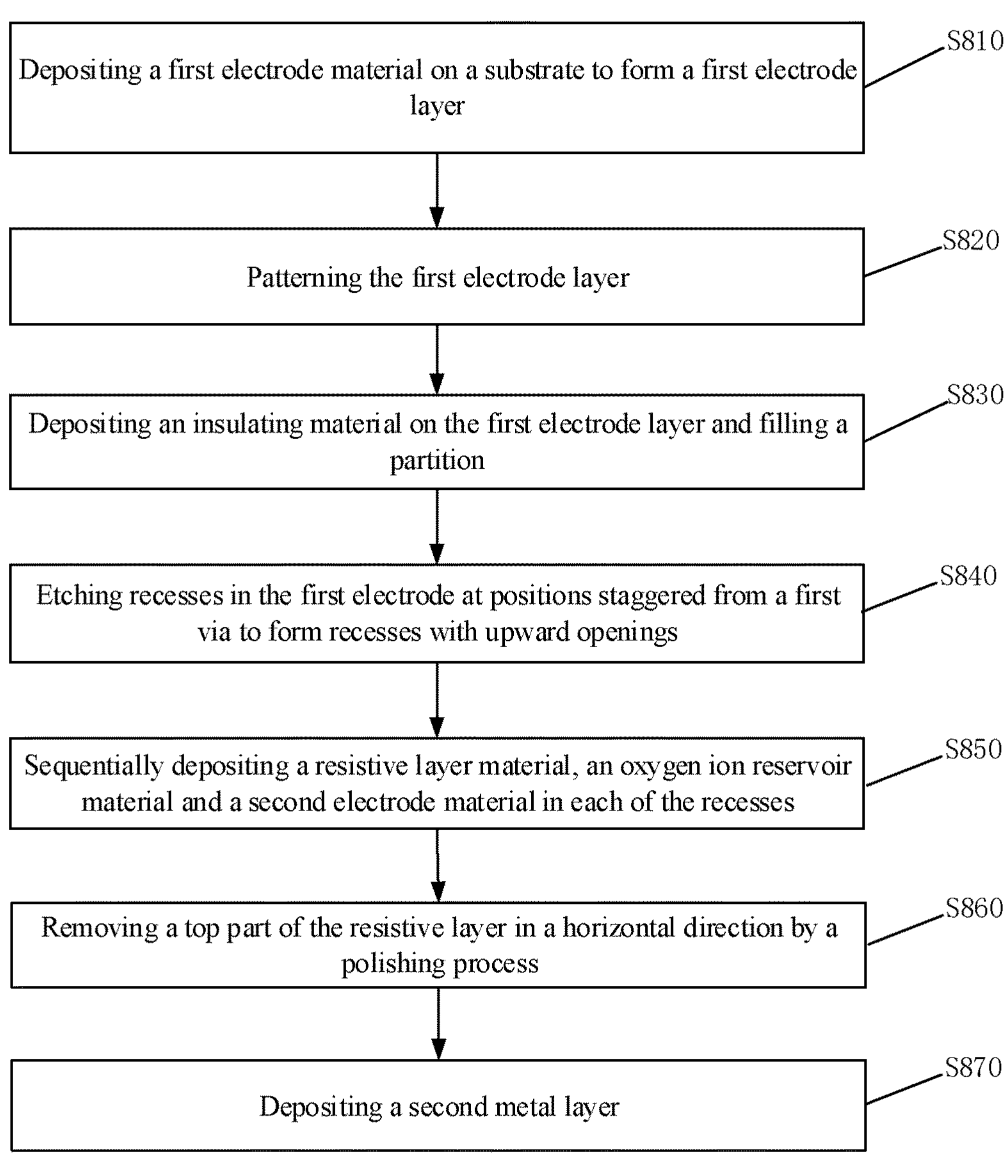
FIG. 8 shows a schematic diagram of a manufacturing process of the embodiment shown in FIG. 1 of the present application.

FIG. 8 shows a main process of manufacturing the semiconductor integrated circuit device shown in FIG. 1, which includes the following steps.

Figure 9:
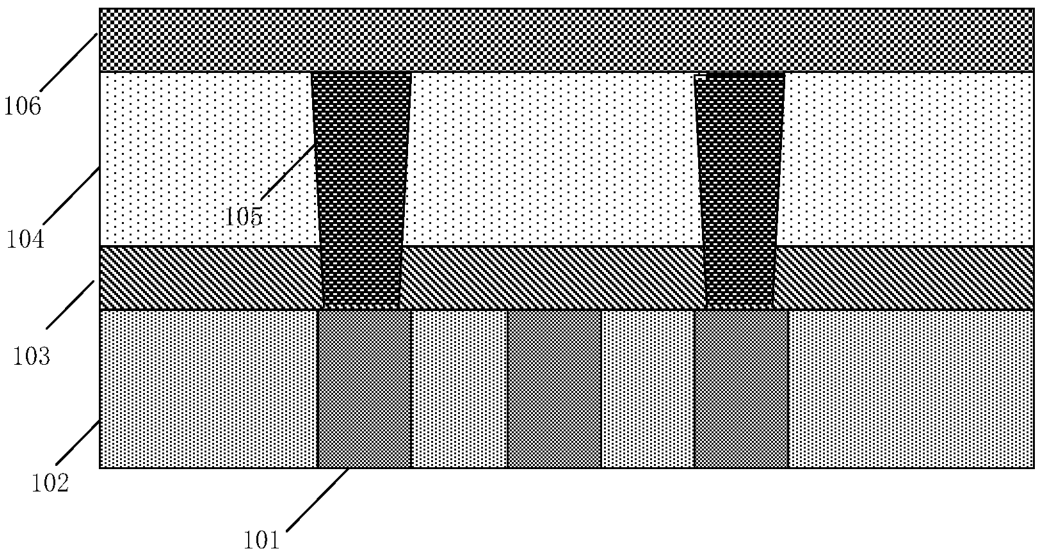
FIG. 9 shows a structural sectional view of a certain stage in the manufacturing process of the embodiment shown in FIG. 1 of the present application.

Step S810: a first electrode material is deposited on a substrate 102 to form a first electrode layer 106, thereby obtaining a structure as shown in FIG. 9.

The substrate 102 includes a dielectric layer 103, a first metal layer 101, an insulating layer 104, and a via 105 connected to the first metal layer 101.

Figure 10:
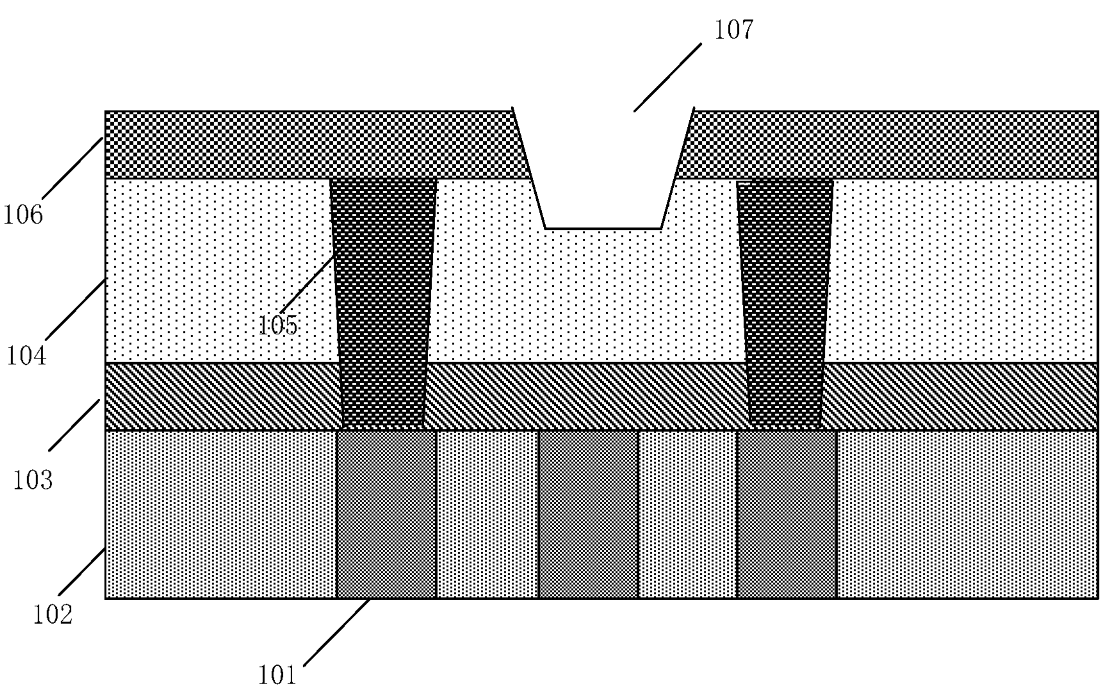
FIG. 10 shows a structural sectional view of a certain stage in the manufacturing process of the embodiment shown in FIG. 1 of the present application.

Step S820: the first electrode layer 106 is patterned to obtain a structure as shown in FIG. 10.

Patterning mainly refers to the formation of a partition 107 between memory cells according to a designed layout or pattern.

The process of forming the partition 107 can use a process of photoetching first and then etching.

Figure 11:
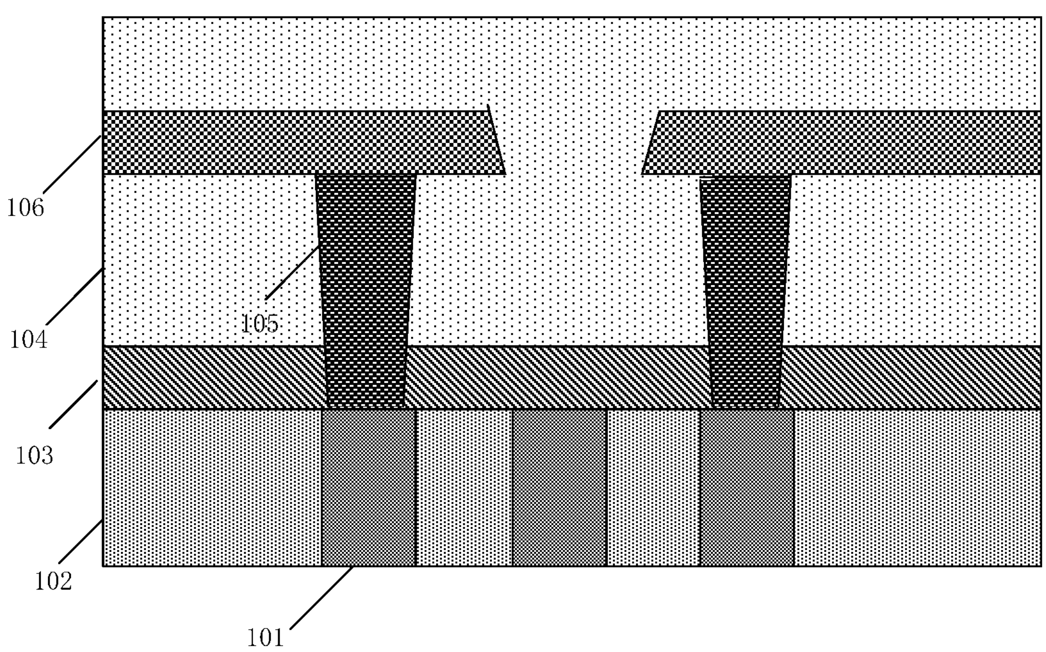
FIG. 11 shows a structural sectional view of a certain stage in the manufacturing process of the embodiment shown in FIG. 1 of the present application.

Step S830: an insulating material is deposited on the first electrode layer and the partition 107 is filled to obtain a structure as shown in FIG. 11.

Figure 12:
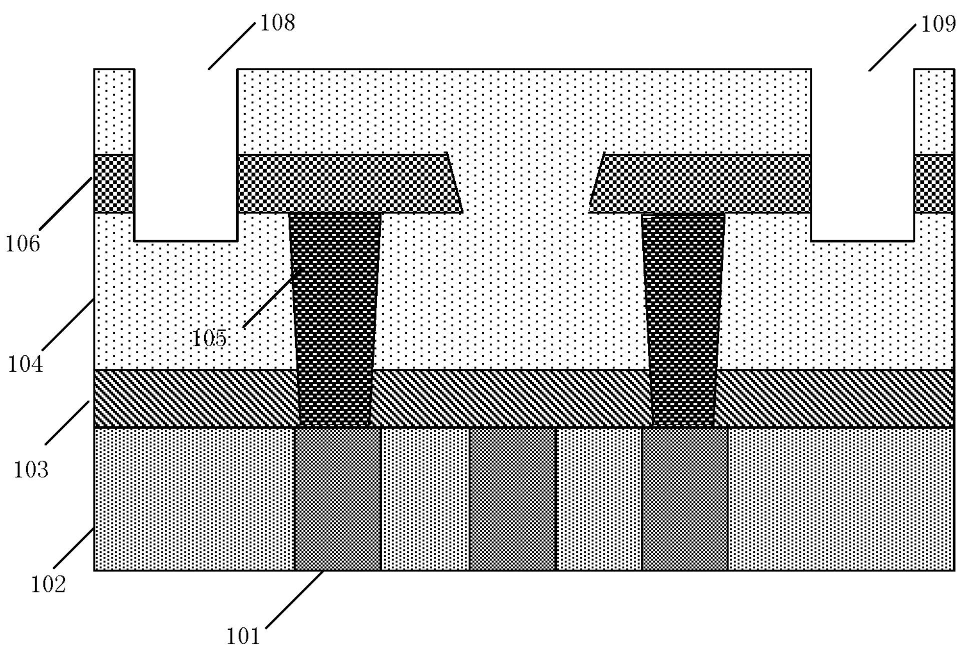
FIG. 12 shows a structural sectional view of a certain stage in the manufacturing process of the embodiment shown in FIG. 1 of the present application.

Step S840: recesses are etched in the first electrode at positions staggered from the first via to form recesses 108 and 109 with upward openings, so as to obtain a structure as shown in FIG. 12.

The process of etching the recesses is a process of photoetching first and then etching.

Figure 13:
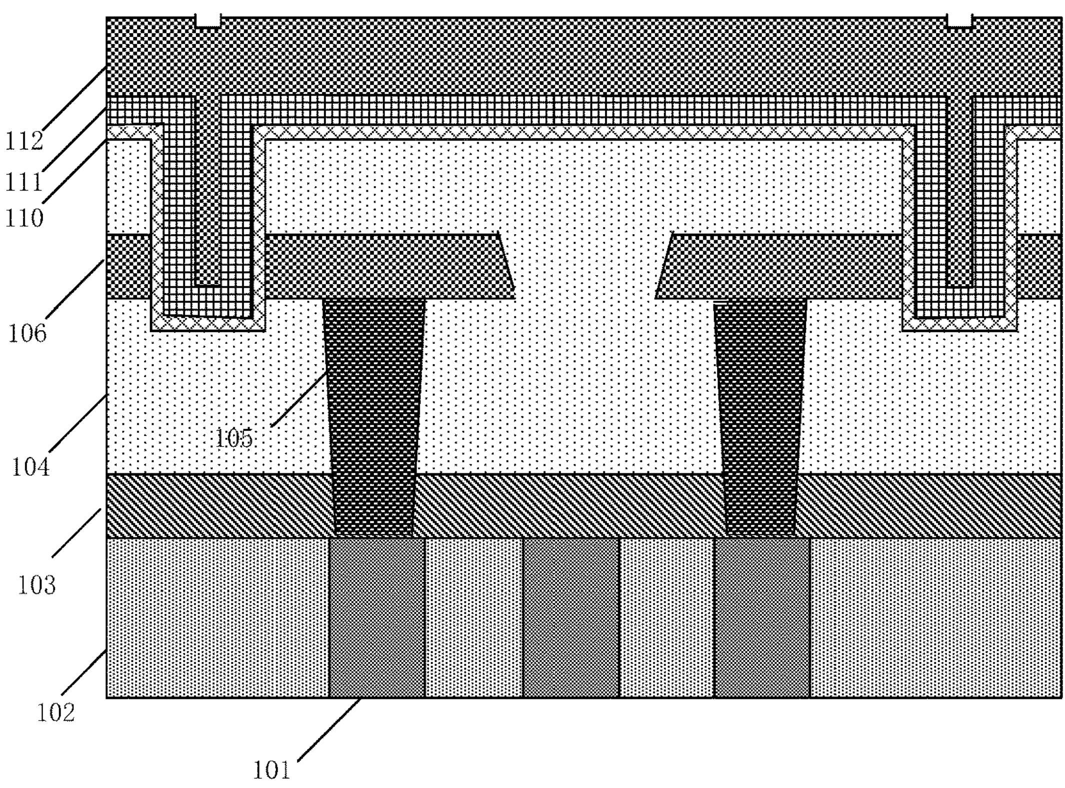
FIG. 13 shows a structural sectional view of a certain stage in the manufacturing process of the embodiment shown in FIG. 1 of the present application.

Step S850: a resistive layer material 110, an oxygen ion reservoir material 111 and a second electrode material 112 are sequentially deposited in each of the recess 108 and the recess 109 to obtain a structure as shown in FIG. 13.

An atomic deposition process can be used when depositing the resistive layer material which may use transition metal oxides (TMO) such as alumina ($Al_xO_y$), copper oxide ($Cu_xO_y$), hafnium oxide ($Hf_xO_y$), etc.

Figure 14:
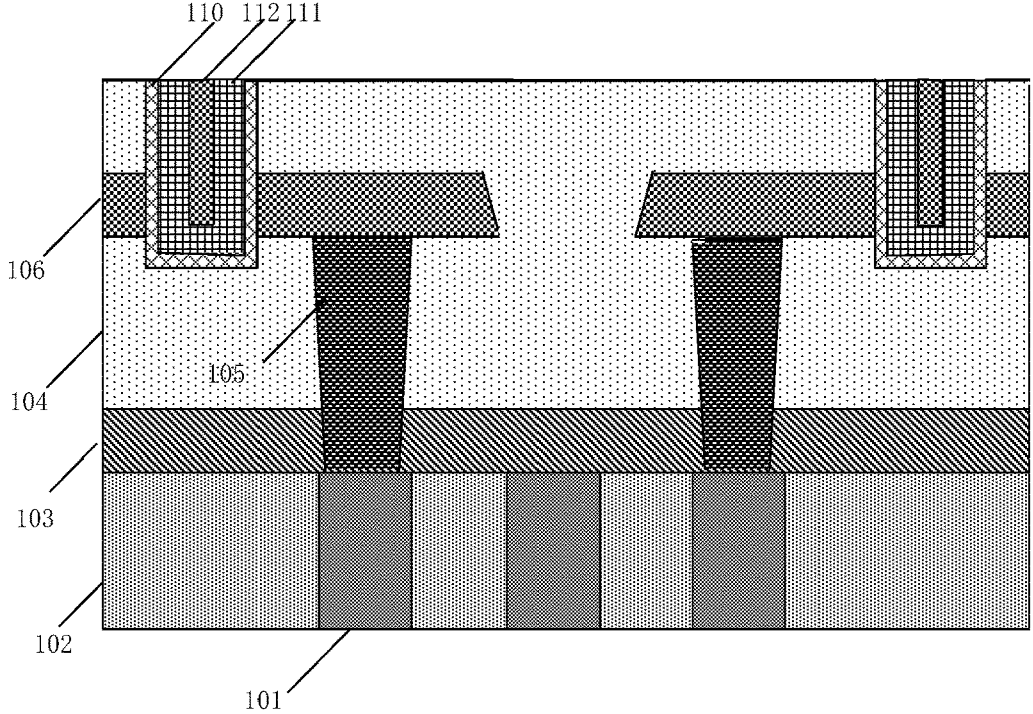
FIG. 14 shows a structural sectional view of a certain stage in the manufacturing process of the embodiment shown in FIG. 1 of the present application.

Step S860: a top part of the resistive layer 110 in a horizontal direction is removed by a polishing process to obtain a structure as shown in FIG. 14.

A chemical mechanical polishing (CMP) process can be used for the polishing process.

Step S870: a second metal layer 113 is deposited to obtain the semiconductor integrated circuit device as shown in FIG. 1.

Figure 15:
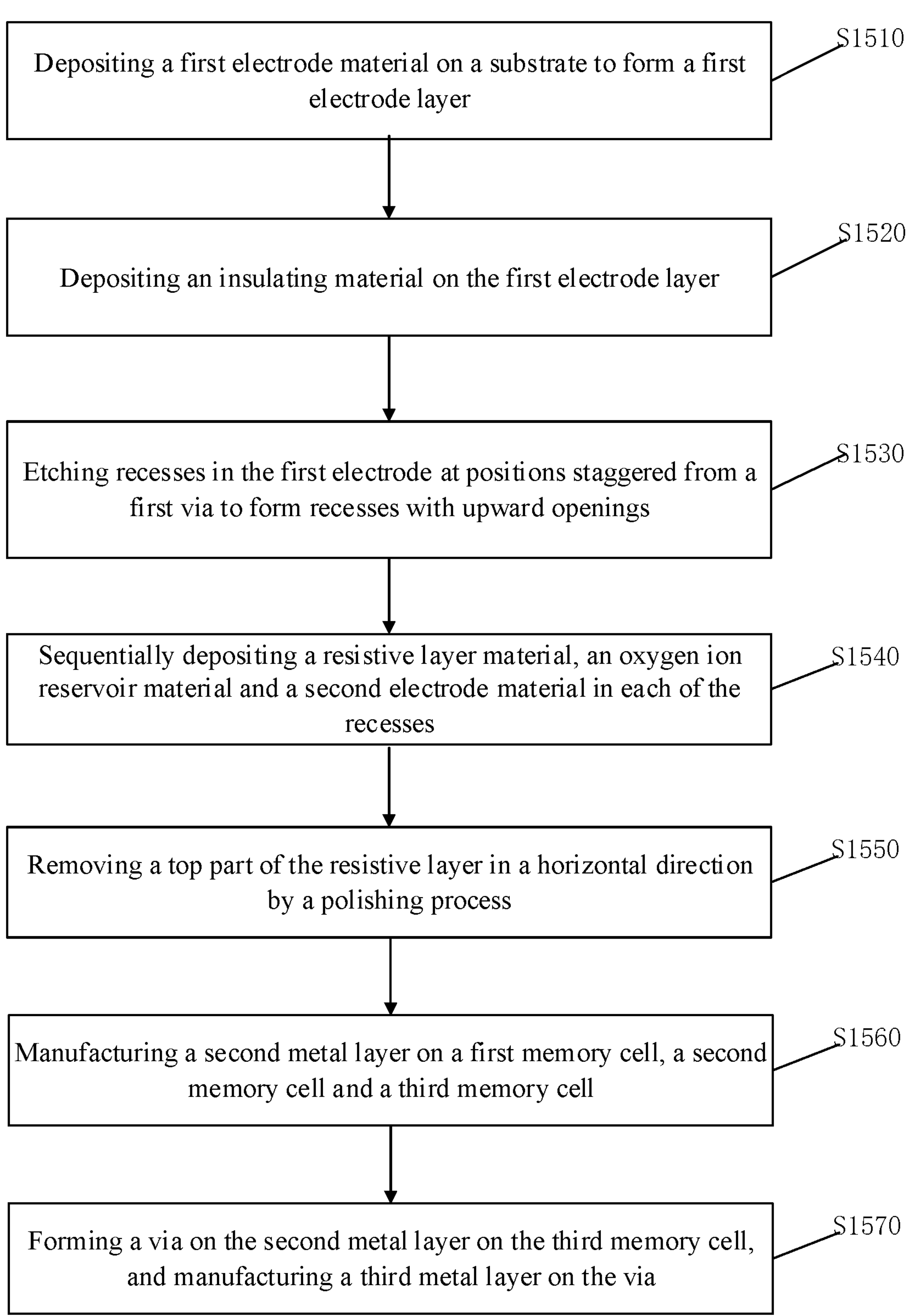
FIG. 15 shows a schematic diagram of the manufacturing process of the embodiment shown in FIG. 3 or FIG. 5 of the present application.

FIG. 15 shows a main process of manufacturing the semiconductor integrated circuit device shown in FIG. 3 or FIG. 5, which includes the following steps.

Figure 16:
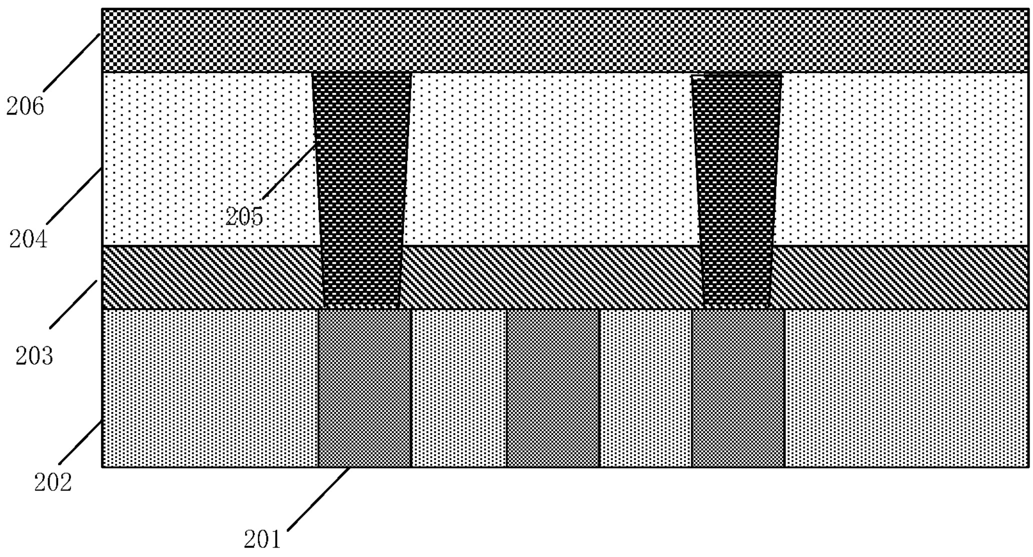
FIG. 16 shows a structural sectional view of a certain stage in the manufacturing process of the embodiment shown in FIG. 3 or FIG. 5 of the present application.

Step S1510: a first electrode material is deposited on a substrate 202 to form a first electrode layer 206, thereby obtaining a structure as shown in FIG. 16.

The substrate 202 includes a dielectric layer 203, a first metal layer 201, an insulating layer 204, and a via 205 connected to the first metal layer 201.

The deposition process can use a vapor deposition process, and any suitable electrode material can be used as the first electrode material, such as aluminum (Al), copper (Cu), gold (Au), platinum (Pt), tantalum (Ta), tantalum nitride (TaN), titanium (Ti), titanium nitride (TIN), tungsten (W), tungsten nitride (WN), etc.

Figure 17:
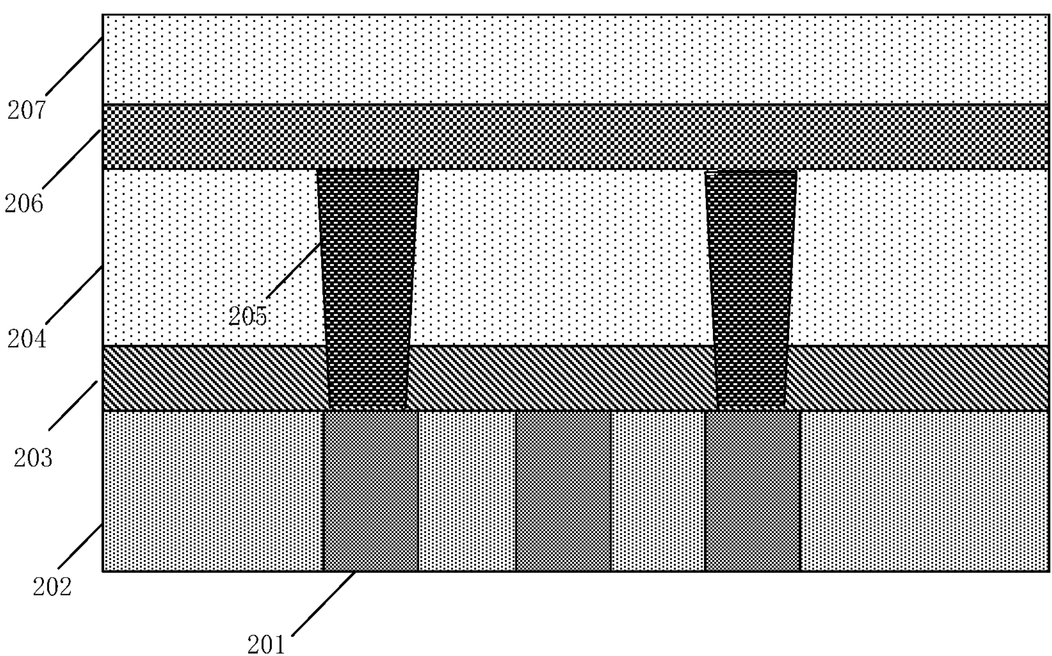
FIG. 17 shows a structural sectional view of a certain stage in the manufacturing process of the embodiment shown in FIG. 3 or FIG. 5 of the present application.

Step S1520: an insulating material 207 is deposited on the first electrode layer 206 to obtain a structure as shown in FIG. 17.

Figure 18:
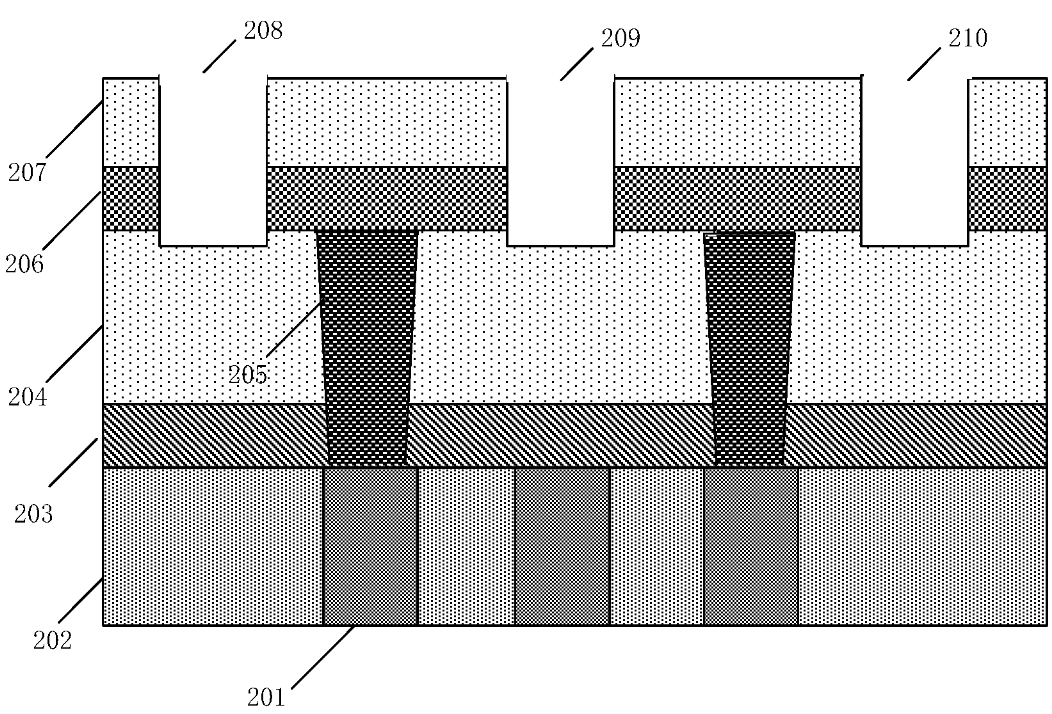
FIG. 18 shows a structural sectional view of a certain stage in the manufacturing process of the embodiment shown in FIG. 3 or FIG. 5 of the present application.

Step S1530: recesses are etched in the first electrode at positions staggered from the first via to form recesses 208, 209 and 210 with upward openings, so as to obtain a structure as shown in FIG. 18.

Figure 19:
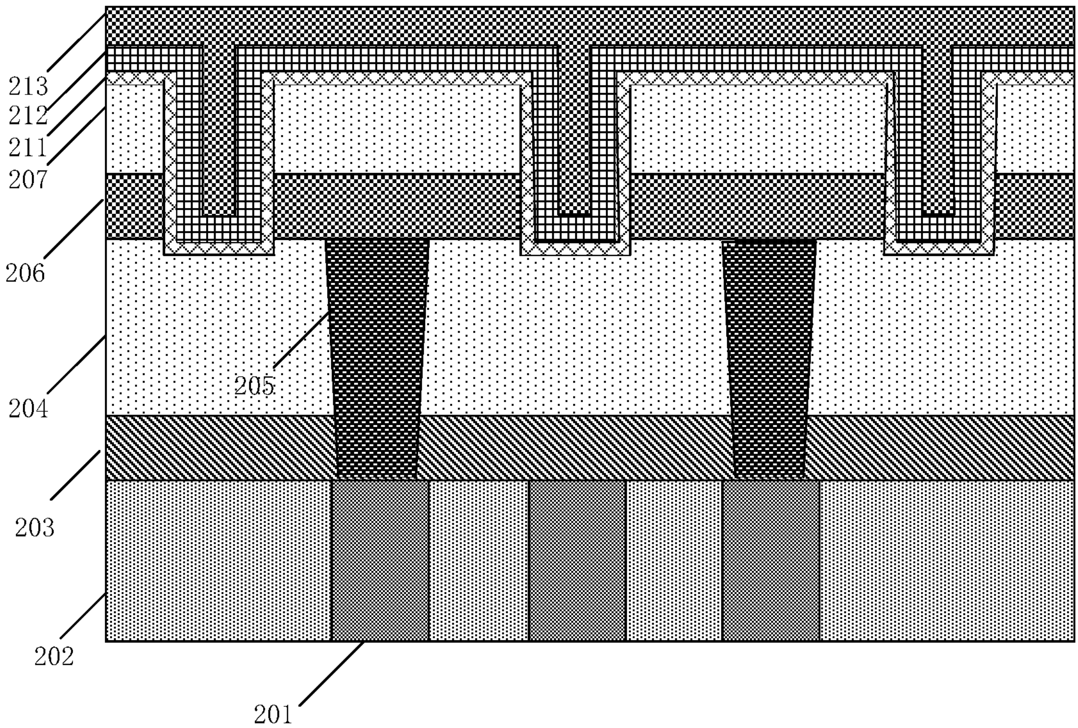
FIG. 19 shows a structural sectional view of a certain stage in the manufacturing process of the embodiment shown in FIG. 3 or FIG. 5 of the present application.

Step S1540: a resistive layer material 211, an oxygen ion reservoir material 212 and a second electrode material 213 are sequentially deposited in each of the recess 208, the recess 209 and the recess 210 to obtain a structure as shown in FIG. 19.

Figure 20:
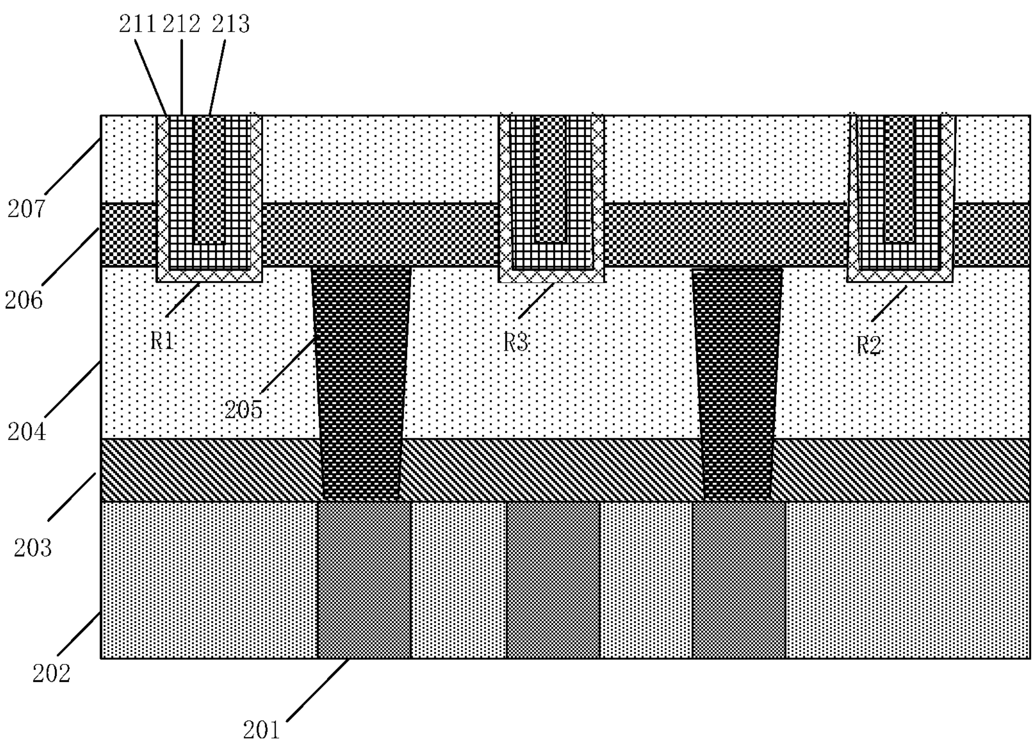
FIG. 20 shows a structural sectional view of a certain stage in the manufacturing process of the embodiment shown in FIG. 3 or FIG. 5 of the present application.

Step S1550: a top part of the resistive layer 211 in a horizontal direction is removed by a polishing process to obtain a structure as shown in FIG. 20.

Step S1560: a second metal layer 214 as shown in FIG. 4 are manufactured on a first memory cell R1, a second memory cell R2 and a third memory cell R3 to obtain the semiconductor integrated circuit device as shown in FIG. 3.

Where, the steps of depositing an insulating layer material 207, etching a recess at a position of the second metal layer 214 shown in FIG. 4, and depositing the second metal layer material in the recess are also included.

On this basis, the following steps continue.

Step S1570: a via 215 is formed above the second metal layer on the third memory cell R3, and a third metal layer 216 as shown in FIG. 6 is manufactured above the via, so that the semiconductor integrated circuit device shown in FIG. 5 can be obtained.

Where, the deposition process includes the following steps of: depositing an insulating layer material 207, and etching a hole at a position of the via 215 shown in FIG. 6; depositing a via material to obtain the via 215; continuously depositing the insulating layer material 207, etching a recess in the position of the third metal layer 216 shown in FIG. 6, and depositing the third metal layer material in the recess.

It should be noted that, in this specification, the term "include", "comprise", or any other variant thereof is intended to cover a non-exclusive inclusion, so that a process, a method, an article, or an apparatus that includes a list of elements not only includes those elements but also includes other elements which are not expressly listed, or further includes elements inherent to such process, method, article, or apparatus. In absence of more constraints, an element limited by "includes a . . . " does not preclude the existence of other identical elements in the process, method, article, or apparatus that includes the element.

In several embodiments provided in the present application, it is to be understood that the disclosed device and method may be implemented in other manners. The foregoing described device embodiments are merely exemplary. For example, the unit division is merely logical function division and may be other division in actual implementation. For example, a plurality of units or components may be combined or integrated into another apparatus, or some features may be ignored or not performed. In addition, the mutual coupling, direct coupling or communication connection of various components shown or discussed can be implemented through some interfaces, indirect coupling or communication connection of devices or units, and can be electrical, mechanical or other forms.

The foregoing descriptions are merely specific implementations of the present application, but the protection scope of the present application is not limited thereto. Any variation or replacement readily figured out by a person skilled in the art within the technical scope disclosed in the present application shall cover within the protection scope of the present application. Therefore, the protection scope of the present application shall be subject to the protection scope of the appended claims.

What is claimed is:

1. A semiconductor integrated circuit device, comprising:

a resistive layer having a trench-like structure with an upward opening; and a first electrode located on an outer side of the resistive layer, and a second electrode located on an inner side of the resistive layer; wherein the first electrode and the second electrode are opposite to each other on two sides of a sidewall of the resistive layer;

wherein the resistive layer, the first electrode and the second electrode form a first memory cell;

further comprising:

a via located below the first electrode;

a first metal layer connected to the first electrode through the via; and a second metal layer connected to the second electrode; and further comprising: a third memory cell having a same structure as the first memory cell, wherein a first electrode of the third memory cell is connected with the first metal layer through a via below.

2. The semiconductor integrated circuit device according to claim 1, further comprising:

a second memory cell having a same structure as the first memory cell, wherein a first electrode of the second memory cell is connected with the first metal layer through a via below, a second electrode of the second memory cell is connected with the second metal layer, and a partition is formed between the first memory cell and the second memory cell.

3. The semiconductor integrated circuit device according to claim 1, wherein a second electrode of the third memory cell is connected with a third metal layer through a second metal layer and a via above, thereby forming a 1T2R structure.

4. A manufacturing method of a semiconductor integrated circuit device, comprising:

forming a first electrode on a substrate, the substrate comprising a first via connected with a first metal layer;

etching a recess in the first electrode at a position staggered from the first via, and forming a resistive layer in the recess, such that the resistive layer has a trench-like structure with an upward opening; and forming a second electrode in the opening of the resistive layer to obtain a first memory cell;

further comprising:

manufacturing a third memory cell while manufacturing the first memory cell, such that a first electrode of the third memory cell is connected with the first metal layer through a via below.

5. The manufacturing method according to claim 4, further comprising:

forming a second metal layer on the second electrode and connecting the second metal layer with the second electrode of the first memory cell.

6. The manufacturing method according to claim 5, further comprising:

manufacturing a second memory cell while manufacturing the first memory cell, such that a first electrode of the second memory cell is connected with the first metal layer through a via below, and a second electrode of the second memory cell is connected with the second metal layer; and forming a partition between the first memory cell and the second memory cell.

7. The manufacturing method according to claim 4, further comprising:

forming a second metal layer, a via and a third metal layer above a second electrode of the third memory cell, such that the second electrode of the third memory cell is connected with the third metal layer through the second metal layer and the via above, thereby forming a 1T2R structure.

* * * * *